United States Patent [19]
Kreifels et al.

[11] Patent Number: 5,526,311
[45] Date of Patent: Jun. 11, 1996

[54] METHOD AND CIRCUITRY FOR ENABLING AND PERMANENTLY DISABLING TEST MODE ACCESS IN A FLASH MEMORY DEVICE

[75] Inventors: Jerry A. Kreifels, El Dorado Hills; Richard J. Durante, Folsom; Alexander C. Mitchell, III, Citrus Heights, all of Calif.

[73] Assignee: Intel Corporation, Santa Clara, Calif.

[21] Appl. No.: 175,599

[22] Filed: Dec. 30, 1993

[51] Int. Cl.⁶ .................................................. G11C 29/00
[52] U.S. Cl. ............................................................ 365/201
[58] Field of Search .................................. 371/21.1, 21.2, 371/21.3, 21.4; 365/201, 208, 218; 395/575, 183.01, 183.06, 183.18

[56] References Cited

U.S. PATENT DOCUMENTS

| | | | |
|---|---|---|---|
| 4,468,759 | 8/1984 | Kung et al. | 365/201 |
| 4,841,482 | 6/1989 | Kreifels et al. | 365/185 |
| 4,860,261 | 8/1989 | Kreifels et al. | 365/218 |
| 5,072,138 | 12/1991 | Slemmer et al. | 365/189.03 |
| 5,077,738 | 12/1991 | Larsen et al. | 371/15.1 |
| 5,134,586 | 7/1992 | Steele | 365/201 |
| 5,134,587 | 7/1992 | Steele | 365/201 |
| 5,177,745 | 1/1993 | Rozman | 375/21.1 |
| 5,239,509 | 8/1993 | Ikawa et al. | 365/201 |
| 5,268,870 | 12/1993 | Harari | 365/218 |
| 5,293,341 | 3/1994 | Tsujimoto | 365/201 |
| 5,299,163 | 3/1994 | Mortigami | 365/201 |
| 5,299,202 | 3/1994 | Vaillancouot | 371/11.1 |
| 5,311,473 | 4/1994 | McClure et al. | 365/201 |
| 5,365,481 | 11/1994 | Sawada | 365/201 |
| 5,369,647 | 11/1994 | Kreifels et al. | 371/25.1 |
| 5,373,472 | 12/1994 | Ohsawa | 365/201 |
| 5,384,741 | 1/1995 | Haraguchi et al. | 365/201 |
| 5,400,281 | 3/1995 | Morigami | 365/201 |
| 5,400,282 | 3/1995 | Suzuri et al. | 365/201 |
| 5,408,435 | 4/1995 | McClure et al. | 365/201 |
| 5,412,793 | 5/1995 | Kreifels et al. | 395/425 |
| 5,416,741 | 5/1995 | Ohsawa | 365/201 |
| 5,416,920 | 5/1995 | Saito et al. | 395/575 |
| 5,448,712 | 9/1995 | Kymett et al. | 365/218 |

*Primary Examiner*—Robert W. Beausoliel, Jr.
*Assistant Examiner*—Albert Décady
*Attorney, Agent, or Firm*—Blakely, Sokoloff, Taylor & Zafman

[57] ABSTRACT

A method of enabling access to a test mode of a semiconductor memory in response to user commands. The method enables test mode access only when a number of "keys" are presented in the proper sequence via the memory device pins. During the first phase of the unlocking process, an array controller determines whether the correct confirmation codes were input via the address and data pins. If they were, the array controller proceeds to the second phase of the unlocking process. During the second phase voltage levels on selected control pins are checked for a transition to a first voltage level. If the control pins transition as required, the array controller proceeds to the third phase. During the third phase, the array controller waits a limited time for receipt of a second test mode enable command. The second test mode enable command must be followed by correct confirmation codes. If the third phase is successfully completed, the array controller writes to a test mode enable access register. As a result, an enable test mode signal becomes active, which allows the user interlace to respond to subsequently issued test mode commands. Also described is a method of eliminating access to the test mode of the semiconductor memory device, which includes a nonvolatile instruction memory.

7 Claims, 17 Drawing Sheets

| MODE | INPUTS a,b | | | | | | | | OUTPUTS c | | INSTRUCTION ARRAY CONDITIONS | | | |
|---|---|---|---|---|---|---|---|---|---|---|---|---|---|---|
| | PCADD (10:0) | ALTADD (10:0) | AEN | WSELECTC (2:0) | USEPB | VPXSW | VPYSW | VPWSW | IW (18:0) | MASEN (15:0) | SOURCE | WORDLINES SELECTED | WORDLINES DESELECTED | COLUMNS SELECTED |
| READ | VVV | XXX | 0 | 0 | 0 | 0 | 0 | 0 | VVVVV | NNNN | Vss | Vcc | Vss | $V_{b1}$ [c] |
| PROGRAM | XXX | VVV | 1 | V | 19 | 1 | 1 | 1 | XXXXX | NNNN | Vss | Vpp | Vss | $V_{p1}$ [e] |
| MAIN ACCESS [f] | XXX | VVV | 1 | V | 19 | 0 | ? | ? | NNNNN | VVVV | Vss | ? | Vss | ? | a. ALL MULTI-BIT SIGNALS ARE DESIGNATED IN HEXADECIMAL.
b. "X" = IGNORED INPUT FOR THIS MODE, "V" = VALID INPUT REQUIRED IN THIS MODE.
c. "N" OUTPUT = NOT DRIVEN BY CODE STORE CIRCUITRY, "V" = VALID OUTPUT IN THIS MODE, "X" = UNKNOWN VALUE.
d. BITLINE VOLTAGE, VBL, DETERMINED BY SENSE PATH CIRCUITRY.
e. PROGRAM LOAD LINE VOLTAGE, VP1, DETERMINED BY READ/WRITE PATH CIRCUITRY.
f. MAIN ACCESS MODE ALLOWS ACCESS TO CODE STORE CIRCUITRY THROUGH READ/WRITE PATH FOR READ PROGRAM VERIFY, ERASE VERIFY AND OTHER OPERATIONS.
g. USEPB IS SET IF THE ARRAY CONTROLLER IS RUNNING FROM THE PAGE BUFFER DURING THESE MODES.

TABLE I

FIGURE 12

| MODE OF CIRCUITRY 40 | INPUTS | | OUTPUTS |
|---|---|---|---|
| | AEN | AADD (10:9) | CG (3:0) |
| READ | X | 00 | 1110 |
| | X | 01 | 1101 |
| | X | 10 | 1011 |
| | X | 11 | 0111 |
| MAIN ARRAY/ PROGRAM | 1 | 00 | 0111 |
| | 1 | 01 | 1110 |
| | 1 | 10 | 1101 |
| | 1 | 11 | 1011 |

TABLE II

FIGURE 13

| AE | WSELECT (1:0) | USEPB | PH1 | PCHG | PGHGB | READ | REFENB |
|---|---|---|---|---|---|---|---|
| X | 00 | 0 | 0 | 0 | 1 | 1 | 0 |
| X | 00 | 0 | 1 | 1 | 0 | 1 | 0 |
| X | 00 | 1 | X | 0 | 1 | 0 | 1 |
| X | NOT 00 | X | X | 0 | 1 | 0 | 1 |
| 0 | 00 | X | X | 0 | 1 | 1 | 1 |

TABLE III

FIGURE 14

| MODE | PBCONFIG (2:0) | DESCRIPTION |
| --- | --- | --- |
| 0 | 000 | DISABLE |
| 1 | 001 | RUN ARRAY CONTROLLER FROM PAGE BUFFER |
| 2 | 010 | USER INTERFACE READS FROM A PLANE-USER MODE |
| 3 | 011 | USER INTERFACE WRITES TO A PLANE-USER MODE |
| 4 | 100 | ARRAY CONTROLLER READS FROM A PLANE |
| 5 | 101 | ARRAY CONTROLLER WRITES TO A PLANE |
| 6 | 110 | USER INTERFACE READS IN TEST MODE-EXTENDED SPACE |
| 7 | 111 | USER INTERFACE WRITES IN TEST MODE-EXTENDED SPACE |

TABLE IV

METHOD AND CIRCUITRY FOR ENABLING AND PERMANENTLY DISABLING TEST MODE ACCESS IN A FLASH MEMORY DEVICE

FIELD OF THE INVENTION

The present invention relates to semiconductor memory devices. More particularly, the present invention relates to a method of enabling test mode access via user commands and for permanently disabling test mode access in a semiconductor memory device.

BACKGROUND OF THE INVENTION

One prior nonvolatile semiconductor memory is the flash electrically erasable programmable read-only memory ("flash"). Flash memories are programmed electrically and, once programmed, retain data until erased. After erasure, flash memories may be programmed with new code or data.

Flash memories differ from conventional electrically erasable programmable read-only memories ("EEPROM") with respect to erasure. Conventional EEPROMs typically use a select transistor for individual byte erasure control. Flash memories, on the other hand, typically achieve much higher densities using single transistor cells. Some prior flash memories are erased by applying a high voltage to the source of every memory cell in the memory array simultaneously. This results in the full array erasure.

Flash memory conventions define a logical one as few, if any, electrons stored on the floating gate of a memory cell. Convention also defines a logical zero as many electrons stored on the floating gate of the memory cell. Erasure of the flash memory causes a logical one to be stored in each cell. Flash memory cells cannot be overwritten individually from a logical zero to a logical one without prior erasure. However, a flash memory cell can be overwritten individually from a logical one to a logical zero, because this entails simply adding electrons to a floating gate that contains the intrinsic number of electrons associated with the erased state.

Erasure, programming and verification of flash memories requires careful control of the voltages required to perform those operations. One prior flash memory is the 28F008SA complimentary metal oxide semiconductor (CMOS) flash memory sold by Intel Corporation of Santa Clara, Calif., which is an 8 megabit flash memory. The 28F008SA flash memory includes a command register to manage erasure and programming. The command register contents serve as input to an internal state machine that controls erasure and programming circuitry.

The 28F008SA implements a test mode, which permits verification of its internal operation. The test mode is accessed by pulling one of the device's control pins to an abnormally high voltage, as is the common practice. For example, in the 28F008SA test mode is accessed by pulling a control pin to 12 volts. While the control pin is held high, the command register recognizes test mode commands that would not ordinarily recognized or executed. A disadvantage of this method of accessing test mode operation is that the abnormally high voltage may not be available in systems, so that verifying device operation requires removing the device from the system. This is increasingly a problem because many flash memory devices are sold in systems, such as memory cards or solid state disks.

SUMMARY OF THE INVENTION

An object of the present invention is to provide a method of enabling access to the test mode without pulling a control pin to a very high voltage.

Another object of the present invention is to provide a method of enabling test mode access that prevents accidentally and unintentionally accessing the test mode.

A still further object of the present invention is provide a method of enabling test mode access that prevents access by virus programs.

A method of enabling access to the test mode of a semiconductor memory in response to user commands is described. The method "unlocks" the test mode only when a number of "keys" are presented in the proper sequence at the memory device pins. Preferably, unlocking test mode access is a three phase process that is triggered by receipt of a first test mode enable command. During the first phase, an array controller within the semiconductor memory determines whether the first set of confirmation codes, or keys, were applied to the address and data pins. If they were, the array controller proceeds to the second phase of the unlocking process. During the second phase voltage levels on a selected control pin should transition to a state which is unusual during normal operation. If the control pins transition as required, the array controller proceeds to the third phase. During the third phase, the array controller waits a limited time for receipt of a second test mode enable command and a second set of confirmation codes. If the third phase is successfully completed, the array controller enables the semiconductor memory to respond to subsequently issued test mode commands.

Also described is a method of eliminating access to the test mode of the semiconductor memory device. The semiconductor memory includes a nonvolatile instruction memory for controlling erasure, programming, etc. of the main memory array. The instruction memory includes a jump table that maps the command code for a test mode access enable command into a pointer to the algorithm for executing that command. Access to this algorithm is eliminated by reprogramming the instruction memory so that the pointer associated with the test mode enable command code no longer points to the algorithm for enabling test mode access.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which:

FIG. 12 illustrates Table I, which defines the modes of operation of the code store circuitry.

FIG. 13 illustrates Table II, which defines the modes of operation of the column grounding circuit.

FIG. 14 illustrates Table III, which defines the operation of the sense path circuitry.

FIG. 15 illustrates Table IV, which defines the modes of operation of the page buffer.

DETAILED DESCRIPTION

Figure 1:
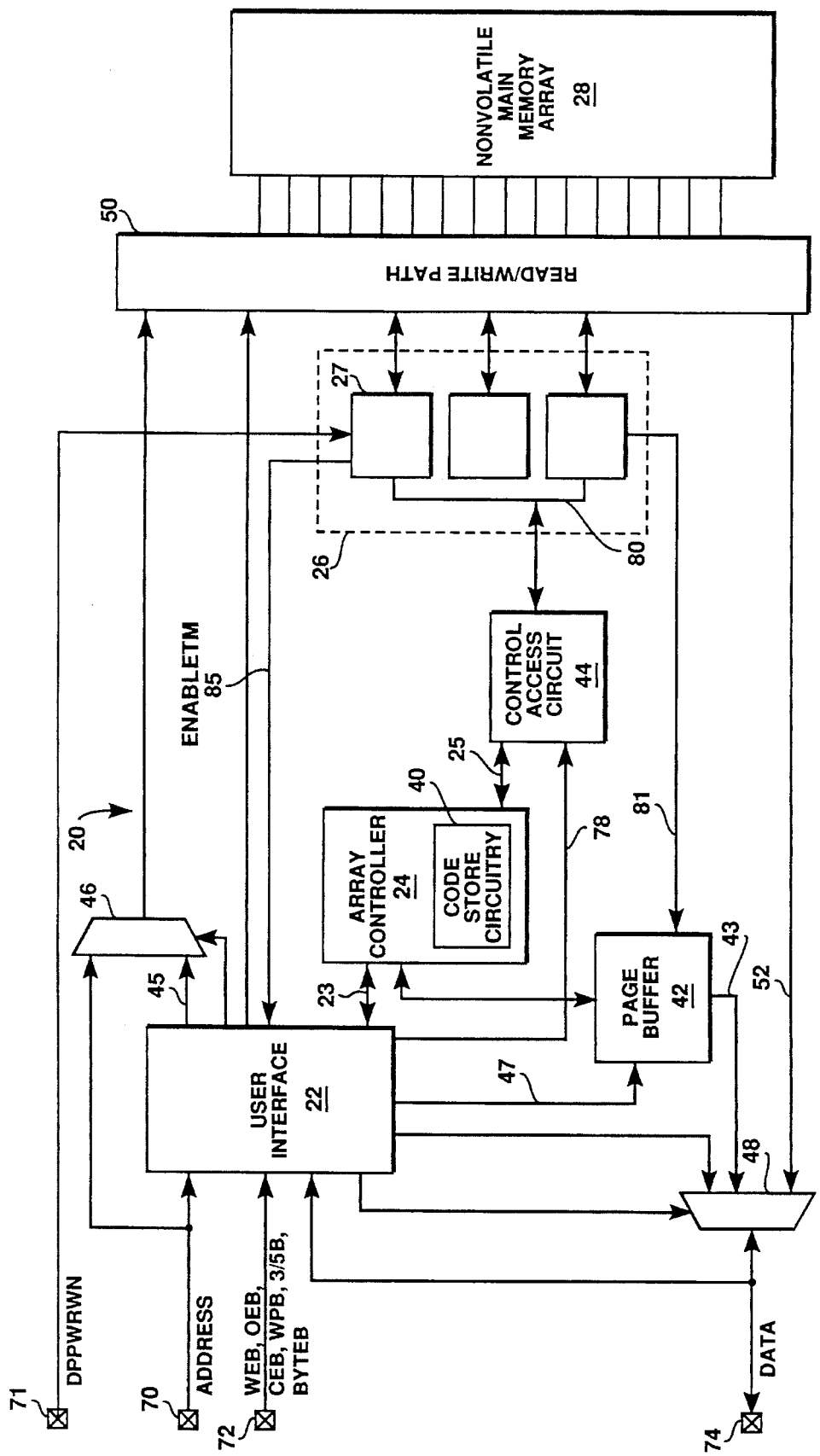
FIG. 1 is a block diagram of a memory device.

FIG. 1 illustrates in block diagram form nonvolatile memory device 20, which incorporates the method and circuitry of the present invention. Memory device 20 includes user interface 22, array controller 24, control register circuits 26 and nonvolatile main memory array 28. Array controller 24 controls the programming and erasure of main memory array 28 using code store circuitry 40.

As will be described in detail below, code store circuitry 40 enables the memory user to access the test mode of device 20 in response to user commands. Briefly described, enabling test mode access, or unlocking the test mode, is at least a two phase process. A first test mode enable command must be received and followed by a first confirmation code applied via pins 70 and 74. If the first confirmation code is correct, then a second test enable command must be received and followed by a second confirmation code that differs from the first confirmation code. Array controller 24 responds to presentation of the "keys" by writing to a latch whose output signal enables user interface 22 to recognize a trap door command. The trap door command allows users to access the control registers 26 and configure memory 20 for testing.

Also to be described in detail is a method of permanently disabling the test mode operation of memory device 20. Briefly, test mode operation is eliminated by reprogramming a pointer within the instruction memory of code store circuitry 40. After programming, the pointer associated with the test mode enable access command code no longer points to the test mode enable algorithm. As a result, the memory device user can no longer access the test mode enable algorithm.

Prior to beginning that detailed discussion, consider again FIG. 1. Memory device 20 also includes control access circuit 44, address multiplexer 46, output multiplexer 48 and read/write path 50. These circuits 44, 46, 48 and 50 in cooperation with user interface 22 and array controller 24, make using main memory array 28 relatively simple for the user.

Main memory array 28 provides random access, nonvolatile, large scale data storage for the external user. Main memory array 28 preferably includes 32 blocks of flash memory cells. Each block of memory provides 64 k bytes of data storage.

Main memory array stores 16 bit wide words, using one flash memory cell to store each bit. Consequently, read/write path 50 includes 16 sensing circuits and high voltage program loads.

User interface 22 functions as an arbiter between the user issuing commands and array controller 24, which executes selected commands. For example, user interface 22 determines if the user's requested operation is valid given the current state of array controller 24 and enable test mode signal, ENABLETM 85. User interface 22 receives as input the command and address information from pins 70, 72, and 74 and determines the operation, or command, array controller 24 should execute.

User interface 22 selects an input address for read/write path 50 via control of input address multiplexer. The selected input address is either the address sensed by TTL buffers (not shown) on user address bus 70, or a latched address 45 from user interface 22.

User interface 22 controls output multiplexer 48 to select a source for output data to the user. That data is transferred over user data bus 74. The selected output data may be either data 52 from read/write path 50 or data 43 from page buffer 42.

Figure 2:
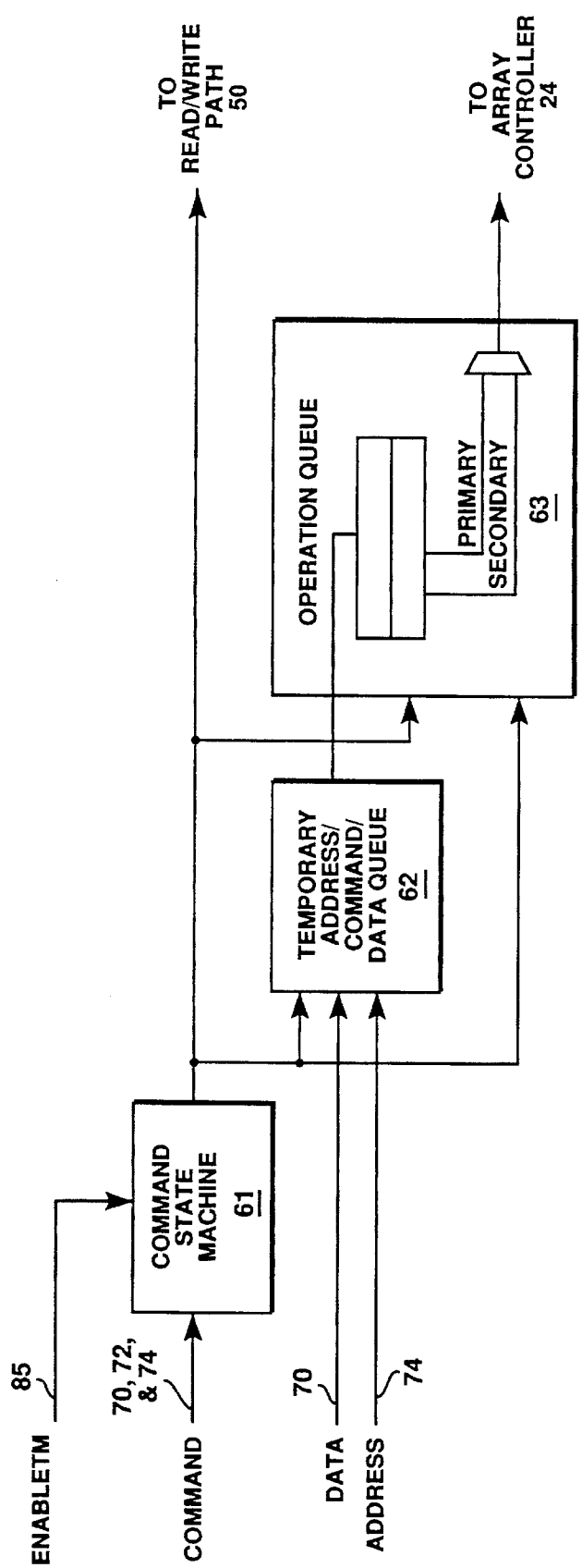
FIG. 2 is a block diagram of a user interface.

User interface 22 includes a command state machine 61, a temporary queue 62 and an operation queue 63 as illustrated in FIG. 2. Command state machine 61 determines the command to be executed based upon command information received from the user. As used herein, "command information" refers to the data input to user interface 22 via control pins 72 and data pins 74. Control pins 72 include write enable bar, WEB, output enable bar, OEB, three volt/five volt bar, 3/5B, chip enable bar, CEB, write protect bar, WPB, and bytebar, BYTEB. (The suffix B denotes that the signals applied to these pins are active low.) The write enable bar pin signals that the memory device user is writing to memory device 20 when it is active low. The output enable bar pin signals user interface 22 that it may drive data pins 74 when OEB is active low. In other words, OEB is driven low in association with read commands. The three volt, five volt bar pin signals whether the memory device user is powering memory device using a three volt supply or a five volt supply. Once memory device 20 is placed within a system, the level applied to 3/5B will normally be constant. As it name implies, when active low CEB selects memory device 20. CEB must be active for the memory device user to command memory device 20. The write protect bar pin determines whether user selected blocks are write protected or not, depending upon the state of block lock bits. While WPB is inactive high user interface 22 ignores block lock bits, and all blocks can be written to by the user. The byte bar pin informs user interface 22 whether to operate in a by-8 mode or by 16 mode. In the by-8 mode, the user inputs data 8 bits at a time. In by-8 mode, writing data to main memory army 28 requires two cycles, or writes. In the by-16 mode, the user inputs data to memory device 20 sixteen bits at a time.

Command state machine 61 decodes the user's command input and dictates to the rest of memory device 20 the steps to execute that command. If the command request received is one to be executed by array controller 24, the command code representative of the command is used to generate an index into a jump table within array controller 24. The index to the jump table, also called an offset vector, is forwarded from the temporary command/address/data queue 62 to operation queue 63. When operation queue 63 is ready to accept the command into one of its two queues, the command is placed into the active queue of operation queue 63. When command state machine 61 transfers information to temporary queue 62 it also sets a flag to tell operation queue 63 that a command is waiting to be added to an available queue.

The two queues within operation queue 63 are the primary queue and the secondary queue. The primary queue indicates the command to be executed or that is executing. The secondary queue stores the next command to be executed, either immediately or upon completion of the command in the primary queue. Once array controller 24 completes execution of the operation located in the primary queue, that operation is removed from operation queue 63 to permit execution of the next operation. Context switching allows execution of a command stored in the secondary queue before completion of the command stored in the primary queue. That is to say, execution of the command code in the primary queue can be interrupted by receipt of a command in the secondary queue.

Returning again to FIG. 1, array controller 24 controls the different components needed to program, erase and verify main memory array 28. Array controller 24 executes the algorithms that sequence the high voltage circuitry of read/write path 50 to apply and remove charge from flash memory cells within main memory array 28.

Control access circuit 44 enables both user interface 22 and array controller 24 to access control registers 26 via central control bus 80. During normal operation, array controller 24 controls control access circuit 44 and thus controls access to control registers 26. Control access circuit 44 passes information to and from array controller 24.

The memory device user can access control registers 26 by issuing a trap door command. The trap door command switches control access circuit 44, and thus control of control registers circuitry 26, to user interface 22. Once the trap door is open, the memory device user can address and write to control registers 26. By doing so, the memory device user is able to configure code store circuitry 40 so that instruction memory 100 can be modified or to place device 20 in test conditions. This is because many of the control signals for code store circuitry 40 and page buffer 42 are generated by registers 26. Control bits within control registers 26 include ALTADD(10:0), AEN, USEPB, VPXSW, VPYSW, VPWSW, PBCONFIG(2:0) and WSELECTC(2:0). Additionally, control registers 26 include a number of bit that permit control of read/write path 50. These bits include WPATHEN, WPATHON and ALTDATA(15:0). The effect of the control register bits upon code store circuitry 40, page buffer 42 and read/write path 50 will be described in detail below.

Control registers 26 are preferably realized as a number of D-type flip-flops, access to each of which is controlled by an individual address decoder.

The memory device user cannot access the user accessible control registers 26 until test mode access has been enabled. This is because until test mode access is enabled user interface 22 treats the trap door command as an invalid command sequence. User interface 22 determines whether the trap door command is valid based upon the state of enable test mode signal, ENABLETM 85. Test mode enable signal 85 is generated by test mode access register 27.

Figure 3:
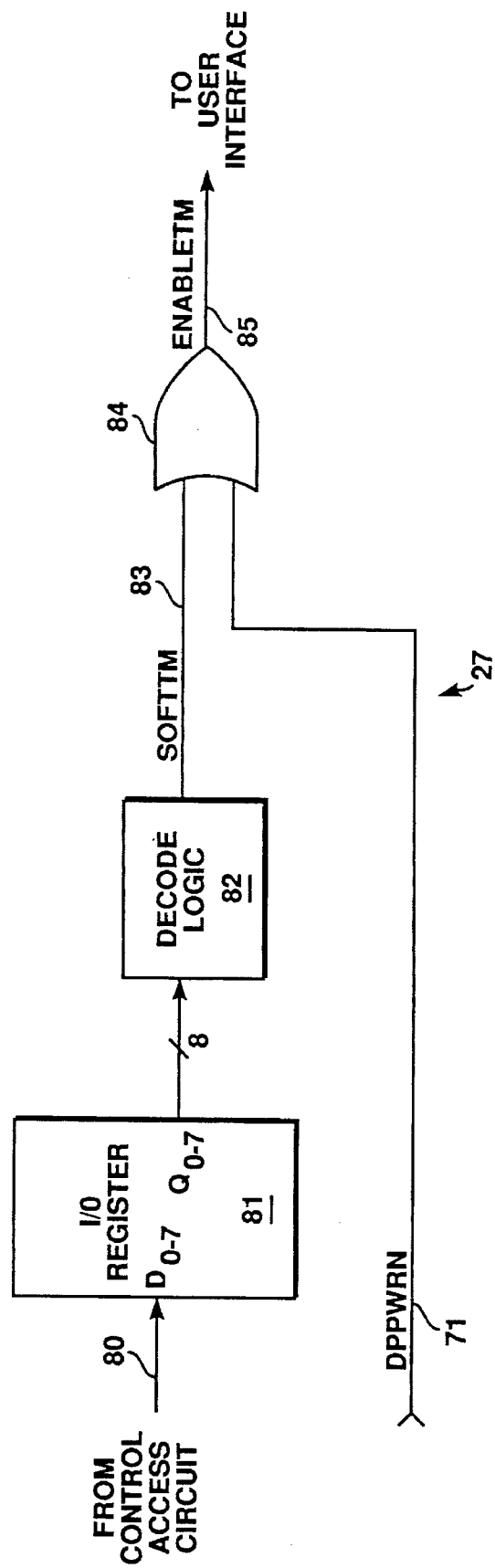
FIG. 3 a block diagram of test mode enable register.

Test mode access enable register 27 is illustrated in block diagram form in FIG. 3. Test mode enable access register 27 includes register 81, decode logic 82 and OR gate 84. Test mode access register 27 permits the memory device user to enable test mode access either by giving test mode access commands or by bringing deep power down pin, DPPWRDWN 71, to an abnormally high voltage level. In response to either event, ENABLETM 85 goes active. Properly issued enable test commands cause array controller 24 to write a code word into register 81. Decode logic 82 decodes the output of register 81, and if it represents the code word, decode logic 82 asserts software test mode enable signal, SOFTTM 83. As a result, ENABLETM 85 goes active, enabling recognition of the open trap door command, which permits user access to control registers 26.

Register 81 is preferably an addressable register including an 8 bit wide D-type flip-flop. Decode logic 82 may be realized using random logic devices. The design of decode logic 82 depends upon the arbitrarily chosen code word.

Returning again to FIG. 1, user interface 22 and array controller 24 share page buffer 42, which allows memory device 20 to operate in a variety of ways. As will be described below, page buffer 42 may also be used to program the instruction memory array within code store circuitry 40.

A. Enabling Test Mode Access

Figure 4:
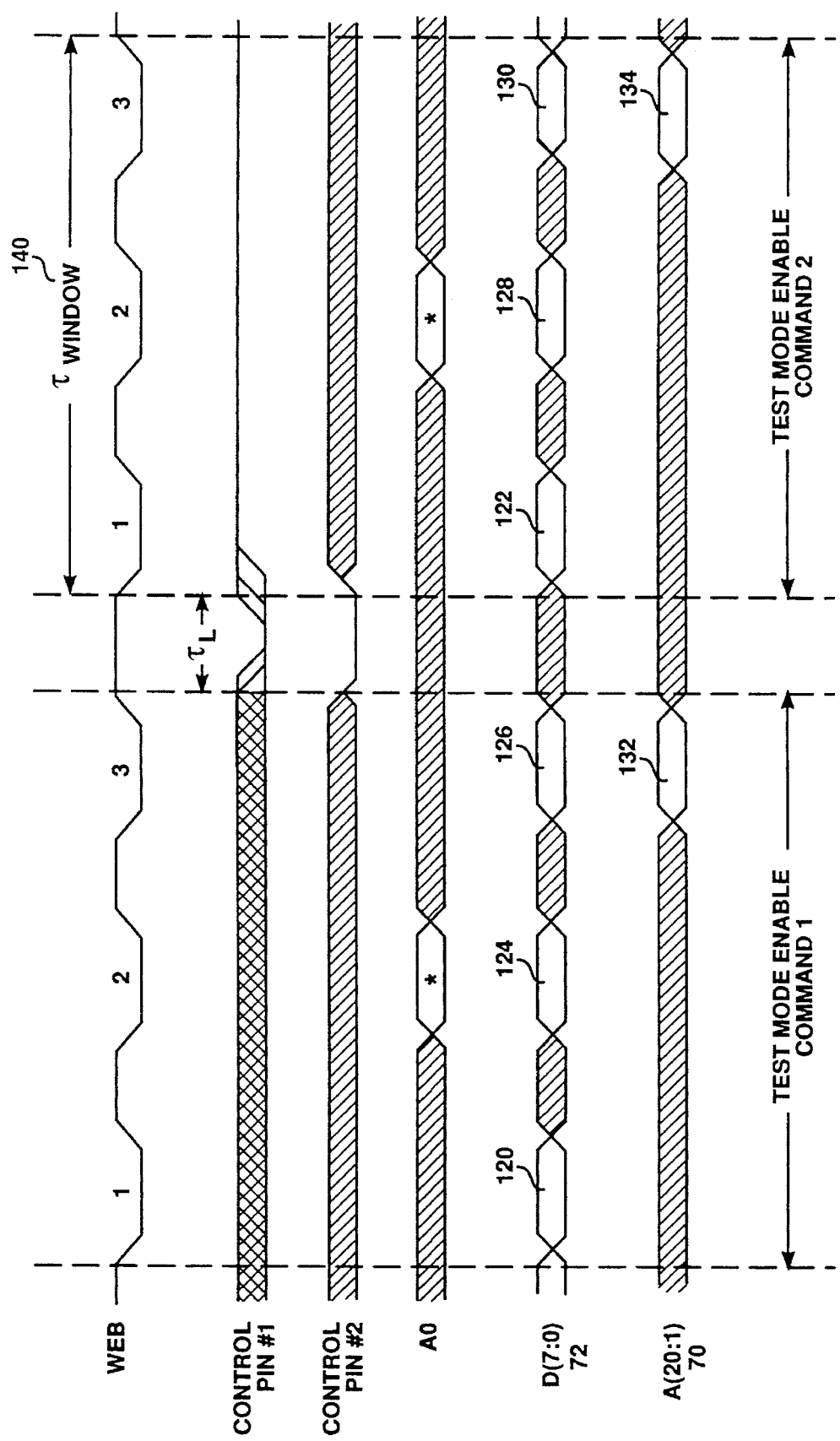
FIG. 4 is a timing diagram illustrating the conditions used to enable test mode access.

Enabling test mode access via user commands permits analysis of nonvolatile semiconductor memory device 20 while it is incorporated in a system that does not provide the abnormally high voltage levels necessary to enable test mode access via deep power down pin 71. While a desirable feature, enabling test mode access via user commands applied to pins 70, 72 and 74 permits users to accidentally enable test mode access and receive unwanted responses to subsequently issued commands. The likelihood of a memory device user accidentally enabling test mode access is substantially reduced, if not eliminated, by the conditions required to enable test mode access because they are unusual during normal use of memory device 20. These conditions can be thought of as a number of keys. FIG. 4 is a timing diagram illustrating preferred test mode enable conditions. Stated another way, FIG. 4 illustrates the preferred keys for unlocking the test mode. Additional restrictions and requirements may be imposed consistent with the method of the present invention. Similarly, fewer than all the restrictions and requirements may be used to implement a method of enabling test mode access in response to user that is unlikely to be accidentally accessed.

Two commands are used to enable test mode access as illustrated in FIG. 4. A first test mode enable command must precede the second test mode enable command. Each test mode enable command takes multiple cycles as indicated by the fact the WEB pin, is brought active low three times during test mode enable command 1 and three times during test mode enable command 2. Unique command codes 120 and 122 applied to data pins 74 represent the first and second test mode enable commands, respectively. What the command codes are for the first test mode enable command and the second test mode enable command does not effect the present invention; they need only be known. Preferably, the first and second test mode enable commands are also different from each other to increase test mode security.

Each test mode enable command is accompanied by confirmation codes to further decrease the probability of accidentally enabling test mode access. Confirmation codes 124, 126, 128 and 130 are input via applied data pins 74 during the second and third cycle of each test mode enable command. Additionally, confirmation codes 132 and 134 are applied to address pins 70 during the third cycle of each test mode enable command. Again, the value of confirmation codes 124, 126, 128, 130, 132 and 134 does not effect the present method. The confirmation codes need only be known. Confirmation codes 124, 126, 128, 130, 132 and 134 can be different from each other to decrease the chances of accidentally enabling test mode access, increase test mode security and to make reverse engineering more difficult.

The second test mode enable command is received and completed within a set period of time after the first test mode enable command. That period of time, $\tau_{window}$ 140, is preferably relatively brief. In the preferred embodiment, $\tau_{window}$ 140 is 20 to 30 microseconds in duration.

One or more control pins transition in an unusual manner after the first test mode enable command has been received and before the second test mode enable command code 122 is received. What is unusual depends upon the pins selected as control pins 1 and 2. Thus, it will be understood that control pins 1 and 2 need not be at the same voltage level at the end of each test mode enable command, nor need they be at the voltage levels illustrated in FIG. 4.

In one embodiment control pins OEB and WPB are used as control pins 1 and 2, respectively. OEB must be held inactive high during while the user is writing a command to memory device 22. That is to say, a user would not pull OEB low during a command sequence so that doing so as required in FIG. 4 is unusual and serves no useful purpose to a user unaware of the test mode. The WPB pin is generally held constant because changing the state of WPB defeats the write protection the pin is intended to provided. Thus, requiring WPB be low after the first test mode enable command and be high after the second test mode enable command is unusual and not likely to occur accidentally.

Control pins other than OEB and WPB may be used as keys to unlock test mode access. For example, memory device users generally hold the BYTEB pin constant, thus requiring the BYTEB pin to toggle would be event not likely to occur accidentally. The same is true of the three volt/five volt bar pin and the chip select bar pin.

Control pin 1 must go low within a defined period of time, $\tau_{golow}$, after completion of the first test mode enable command. Preferably, control pin 1 goes low within 6 microseconds of completion of the first test mode enable command. Additionally, the voltage on the control pin 1 should be held low a minimum about of time, $\tau_{LOW}$. Preferably, the voltage applied to control pin 1 is held low at least 3.5 microseconds. FIG. 4 illustrates the sum of $\tau_{golow}$ and $\tau_{LOW}$ as $\tau L$.

Figure 5:
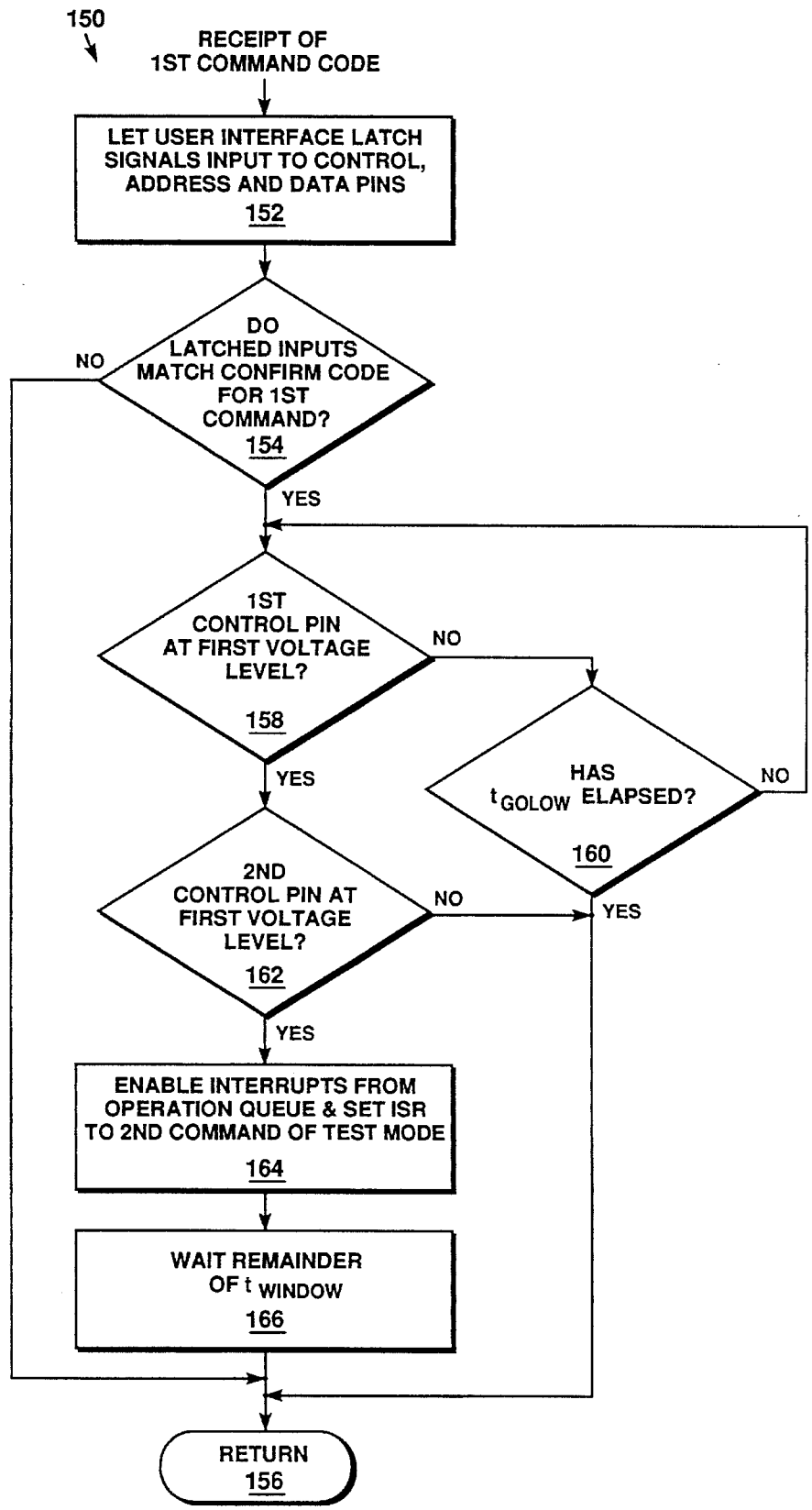
FIG. 5 is a flow diagram of a method of determining whether a first set conditions for enabling test mode access have been met.
Figure 6:
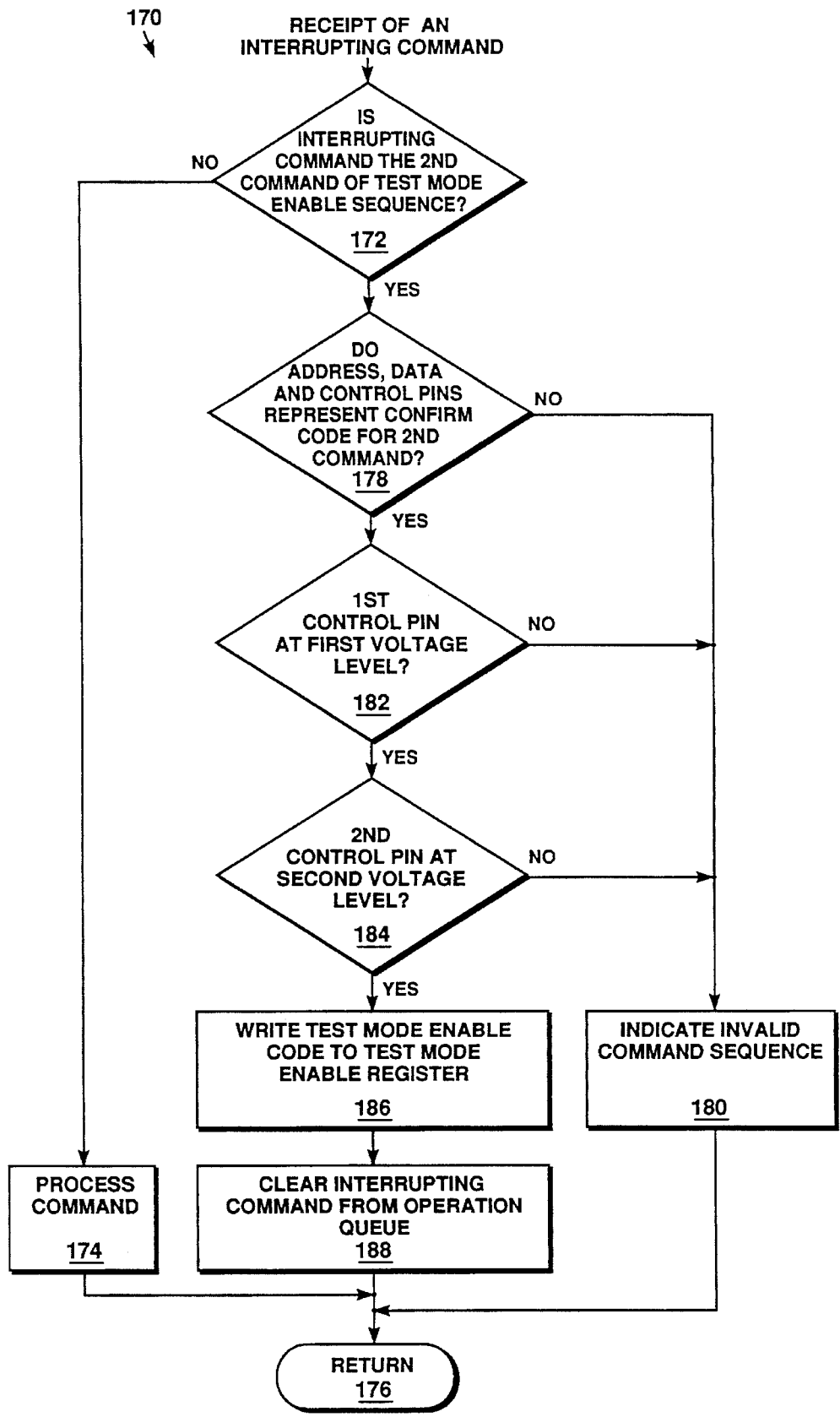
FIG. 6 is a flow diagram of a method of determining whether a second set conditions for enabling test mode access have been met.

FIGS. 5 and 6 illustrate in flow diagram form a method of unlocking test mode access by determining whether the user has presented the keys defined by FIG. 4. The algorithms illustrated are implemented by array controller 24 and stored within code store circuitry 40.

Algorithm 150 of FIG. 5 determines whether a first set conditions for unlocking the test mode have been satisfied. Array controller 24 begins executing algorithm 150 upon receipt of command code 120, which represents the first test mode enable command. During step 152 user interface 22 latches the signals applied to data pins 74 during the second and third cycle of the first test mode enable command and to address pins 70 during the third cycle.

Array controller 24 branches to step 154 from step 152 to compare the signals latched during step 152 to confirmation codes 124, 126 and 132. If the latched signals do not represent the confirmation codes, then array controller 24 branches from step 154 to step 156. Test mode access is not enabled, instead array controller 24 acts as if nothing occurred. As a result, algorithm 150 has no impact upon memory device users who accidentally issue the first test mode command code. On the other hand, if the latched signals do match confirmation codes 124, 126 and 132, array controller 24 branches from step 154 to step 158 to determine whether the first transition of control pins 1 and 2 has occurred.

Array controller 24 determines in step 158 whether the voltage applied to the first control pin is at a first voltage level. If it is not, array controller 24 branches to step 160 to determine if the period of time allowed for this transition, $\tau_{golow}$, has elapsed. If it has not, then array controller 24 continues to monitor the voltage applied to the first control pin by branching through steps 158 and 160 until one of two events occurs. If $\tau_{golow}$ elapses without the first control pin going to the first voltage level, then one of the keys required to unlock the test mode has not been presented. Array controller 24 responds by branching from step 160 to step 156, again not giving the user any indication receipt of the first test mode enable access command. However, if the voltage applied to the first control pin goes to the first voltage level before $\tau_{golow}$ elapses then array controller 24 branches from step 158 to step 162.

Array controller 24 determines in step 162 whether the voltage applied to the second control pin is at the first voltage level. If it is not, array controller 24 responds by branching to step 156 because the requirements of FIG. 4 have not been satisfied. However, if array controller 24 determines that the second control pin is held at the first voltage level, then array controller 24 branches to step 164.

Array controller 24 enables response to the second test mode command, should it be received, in step 164. Array controller 24 does so by enabling commands placed within operation queue 63 to interrupt execution of algorithm 150. During step 164 the interrupt start routine is set to algorithm 170, the algorithm for determining whether the remaining keys to unlock test mode access have been presented. Having algorithm 170 interrupt algorithm 150 also ensures the first test mode access command is received before responding to the second test mode enable command.

Having ensured that the first test mode command preceded the second test mode enable command, array controller 24 proceeds to step 166 to await an interruption. If an interrupt is not received within $\tau_{window}$ 140, array controller 24 branches to step 156. Test mode access will not be enabled. On the other hand, if an interruption is received within the window of time 140, array controller 24 begins executing algorithm 170.

In alternate embodiments, a latch may be set to signal that the first test mode enable command has been received and preceded receipt of the second test mode enable command. However, in this embodiment the time elapsed between receipt of the two test mode enable commands is difficult to determine. Thus, this embodiment does not offer the same advantages offered by having the second test mode enable command interrupt the algorithm executed in response to the first test mode enable command.

FIG. 6 illustrates in flow diagram form algorithm 170, which is executed by array controller 24 upon receipt of the second test mode enable command if it follows the first test mode enable command. Preferably, algorithm is executed in response to an interruption of algorithm 150. Algorithm 170 determines whether the interrupting command is the second test mode command, and if so, whether all remaining requirements for unlocking test mode access have been satisfied.

Array controller 24 begins in step 172 by examining the command code stored in the secondary queue of operation queue 63. Array controller 24 responds to all command codes other than command code 122 by branching to step 174. During step 174, array controller 24 executes the interrupting command. Thus, the existence and execution of the first test mode enable command is transparent to the memory device user. Afterward, array controller 24 branches to step 176. As a result, test mode access cannot be enabled without starting the unlocking process over.

If the interrupting command is the second test mode enable command, array controller 24 proceeds to step 178 to determine whether all other conditions for enabling test mode access have been met. Array controller 24 begins in step 178 by comparing the address and data signals latched by user interface 22 during the second and third phases of the second test mode enable command to confirmation codes 128, 130 and 134. If the latched signals do not represent these confirmation codes, then array controller 24 branches from step 178 to step 180. Array controller 24 then indicates to the user receipt of an invalid command sequence. Array controller 24 then exits algorithm 170. On the other hand, if confirmation codes 128, 130 and 134 are received, array controller 24 advances to step 182.

Array controller 24 determines in step 182 whether the voltage applied to control pin 1 has transitioned from the first voltage level to the second voltage level. If it has not, then the conditions for unlocking test mode access have not been satisfied. Array controller 24 responds by branching to step 180, where an invalid command sequence is indicated. On the other hand, if the voltage on control pin 1 has transitioned from the first voltage level to the second voltage level, then array controller advances to step 184.

Array controller 24 determines in step 184 whether the voltage applied to the second control pin has transitioned from the first voltage level to the second voltage level. If it has not, array controller 24 responds by branching to step 180. Test mode access will not be enabled. However, if array controller 24 determines that control pin 2 has transitioned as desired, then all requirements associated with enabling test mode access have been met. Array controller 24 responds by branching to step 186.

Array controller 24 enables test mode access in step by 186 by addressing control register 27 and writing the code word into it. As a result, as previously discussed, enable test mode signal 85 is asserted and user interface 22 will be able to respond to subsequently issued trap door commands.

In step 188, array controller 24 clears the interrupting test mode enable command from operation queue 63. Algorithm 170 then preferably returns control of array controller 24 to algorithm 150, where execution halts.

Thus, a method of enabling test mode access in response to user commands has been described. A first test mode enable command and a first confirmation code must precede a second test mode enable command and a second confirmation code. In response to the proper sequence of events, army controller 24 unlocks test mode access by enabling user interface 22 to recognize subsequently received trap door commands.

B. Permanently Disabling Test Mode Access

The best means of preventing end users from accidentally enabling the test mode is to permanently disable the test mode after memory device 20 has been tested. This can be done without removing memory device 20 from the system of which it forms a part. Additionally, test mode access can be disabled rapidly using the present methods because they do not require erasing code store circuitry 40, and reprogramming and reverifying the programming of all algorithms stored by code store circuitry 40.

Figure 7:
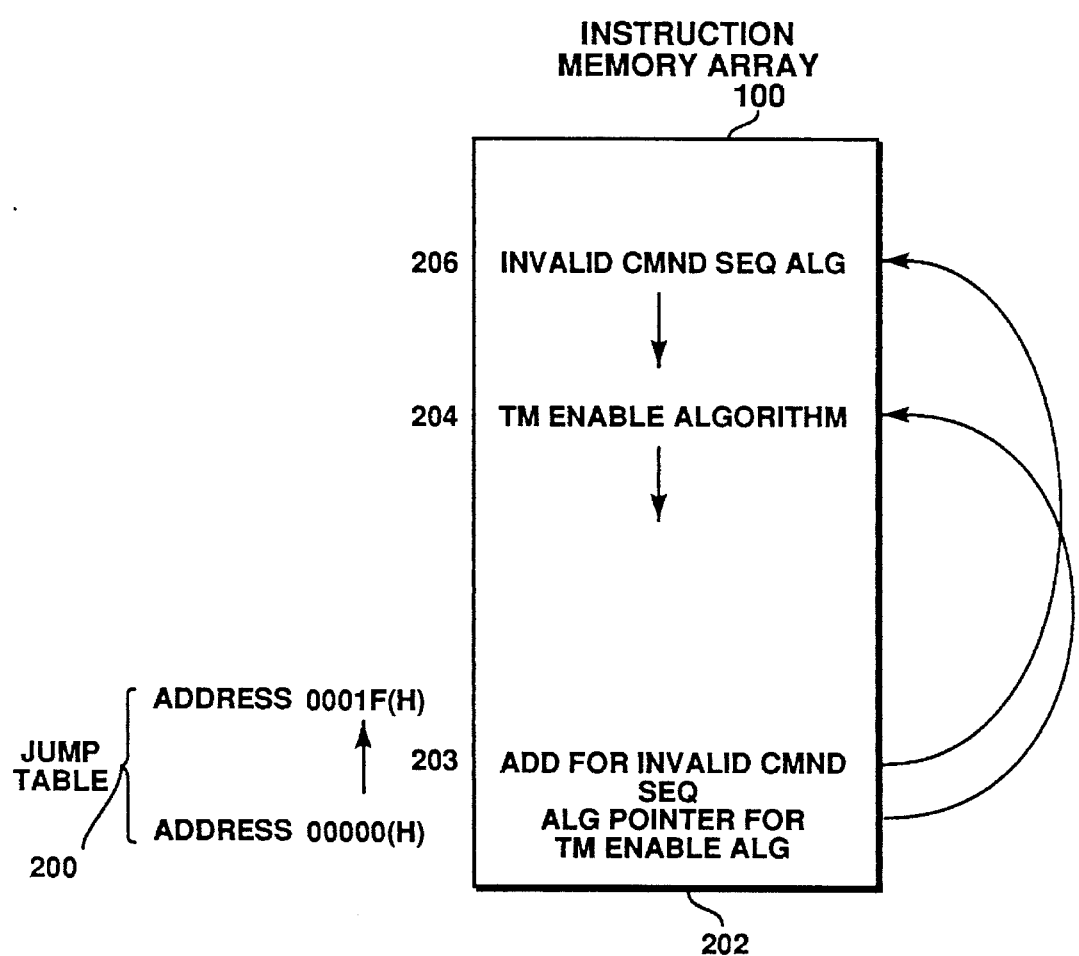
FIG. 7 is a memory map of the instruction memory array within the array controller.

As stated previously, algorithms 150 and 170 for enabling test mode access are stored in a nonvolatile instruction memory array within code store circuitry 40. FIG. 7 illustrates the organization of instruction memory array 100. The first group of memory addresses 200 form a jump table, which maps each command code into a pointer. Each pointer points to a second location where the algorithm associated with the command code is stored. The command code for the first test mode enable command maps to a first pointer stored at address 202. The first pointer points to address location 204, which is the starting address of algorithm 150. Because instruction memory 100 is nonvolatile, the first pointer can be reprogrammed so that it no longer points to algorithm 150. As a result, test mode access can no longer be enabled. The first pointer is preferably changed so that it points to the starting address 206 of the algorithm for responding to invalid command sequences.

Preferably, the difference between the first pointer 202 and a second pointer, stored at address 203 and pointing to algorithm 206, is such that programming alone can be used to change the first pointer to the same value as the second pointer. In other words, only logic "1's" will be changed to logic "0's". Consequently, disabling test mode access is much faster than it would be otherwise because doing so does not require erasing and reprogramming code store circuitry 40. Nor does it require reverification of the programming of code store circuitry 40, which is time intensive.

Figure 8:
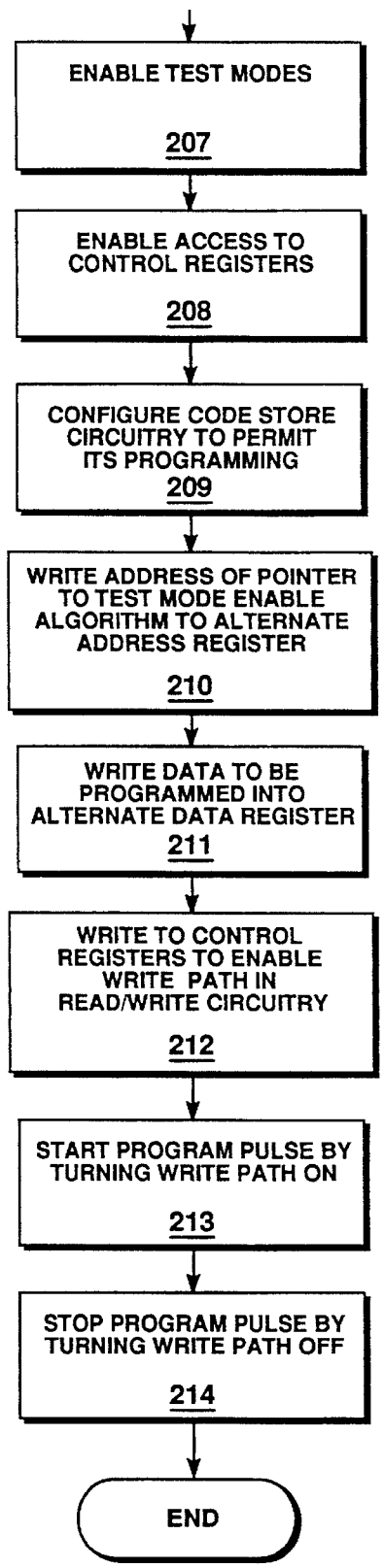
FIG. 8 is a flow diagram of one method of permanently disabling test mode access.

FIG. 8 illustrates in flow diagram form one method of disabling test mode access by reprogramming the first pointer in instruction memory array 100 without first erasing instruction memory array. These steps can be performed by a user external to memory device 20.

Reprogramming the first pointer requires configuring code store memory array 40 to permit programming of instruction memory array 100. This requires gaining access to control registers 26. Thus the external user's first task is to enable to test mode access. The external user does so in step 207 using the methods previously discussed with respect to FIGS. 5 and 6. As a result of step 207, user interface 22 now recognizes the trap door command, which enables user access to control registers 26. Accordingly, in step 208 the external user issues the trap door command.

Afterward, in step 209 the external user begins configuring code store circuitry 40 to permit the programming of instruction memory array 100. This involves a series of writes to specific control bits contained in control registers 26. Those bits and their effect upon code store circuitry 40 will be described in detail later.

The present method is not limited by code store circuitry 40 and the signals to configure it. The present method will also work for any nonvolatile semiconductor memory using a nonvolatile instruction memory array to store instructions for programming, erasing and reading a main memory array and a test mode enable algorithm that is accessed by a pointer also stored in the nonvolatile instruction memory array.

The external user advances to step 210 from step 209. In step 210 the external user sets the alternate address bits ALTADD(10:0) to address 202, associated with the first pointer. This is accomplished by writing to control registers 26. In step 211 the external user then indicates the data to be programmed at that address by setting the alternate data bits ALTDATA(15:0) to program those bits of the first pointer that differ from the second pointer, which points to the algorithm for invalid command sequences. In the preferred embodiment, only one bit will have to be set.

Instruction memory array 100 is programmed using the write path of read/write path 50. This requires that external user first enable the write path, as shown in step 212. The external user does so by writing to control registers 26 to set the write path enable bit, WPATHEN. The external user then turns on the write path in step 213 by setting the write path on bit, WPATHON. This starts the program pulse for this bits set to a logic 1 by ALTDATA(15:0). The external user stops the programming pulse in step 214 by clearing WPATHON. As a result of programming, the first pointer should no longer point to test mode enable algorithm 204. Though not illustrated in FIG. 8, the user may wish to verify the reprogramming of pointer 202 by placing instruction memory array 100 in main array mode and reading pointer 202.

Figure 9:
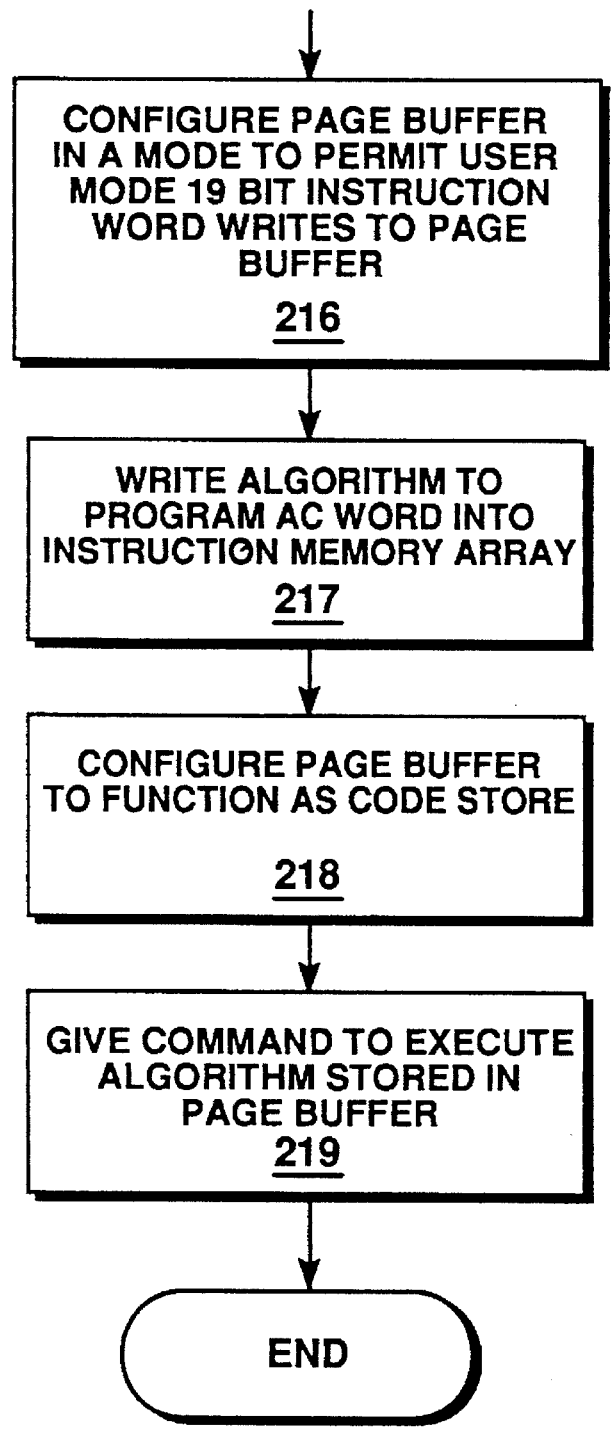
FIG. 9 is a flow diagram of another method of permanently disabling test mode access.

FIG. 9 illustrates in flow diagram form another method of permanently disabling test mode access by reprogramming the first pointer without first erasing instruction memory array 100. This embodiment uses array controller 24 to program instruction memory array 100. That is to say, steps 209–214 of FIG. 8 are performed by array controller 24.

Because instruction memory array 100 usually provides source instruction words to array controller 24 another source of instruction words must be obtained prior to programming the first pointer. When properly configured page buffer 42 can provide instruction words to array controller 24. Thus, in step 216, page buffer 42 configured to permit its later use as a control store. That is to say, page buffer 42 is configured in step 216 so that it can be loaded with the 19 bit instruction words required by array controller 24.

Next, in step 217 the user begins loading page buffer 42 with the algorithm to enable programming of instruction memory array 100 and to program the first pointer. Enabling programming of instruction memory array 100 requires appropriately setting control bits within control registers 26, as will be described in detail later. The control bits necessary to control program pulse duration have been discussed previously. Programming algorithms are well known in the art and will not be described in detail herein.

In step 218 the user configures page buffer 42 to function as the source of instructions for array controller 24, rather than code store circuitry 40. A method of doing so will be described in detail later.

Finally, in step 219, the user issues a program command. As with a regular program command, the command is a two or three cycle command depending on whether the user is operating in by 8 or by 16 mode. During the first cycle the program command code is given. In the next cycle or cycles, the user indicates the pointer value to be programmed via data pins 74 and the address at which to store the new pointer via address pins 70. Array controller 24 responds by executing the algorithm in page buffer 42, which programs the first pointer to point to an address other than second address 204. Afterward, no pointer in jump table 200 points to algorithm 150 and enabling test mode access is no longer possible.

Thus, methods of permanently disabling test mode access by reprogramming a pointer within instruction memory array 100 that points to the algorithm for enabling test mode access have been described. The pointer can reprogrammed using an external controller or by using array controller 24 in conjunction with page buffer 42. Both methods of disabling test mode access permit reprogramming of the pointer without first erasing code store circuitry 40 and then having to reprogram and reverify the programming of code store circuitry 40. Consequently, test mode access can be rapidly eliminated.

C. The Array Controller

Figure 10:
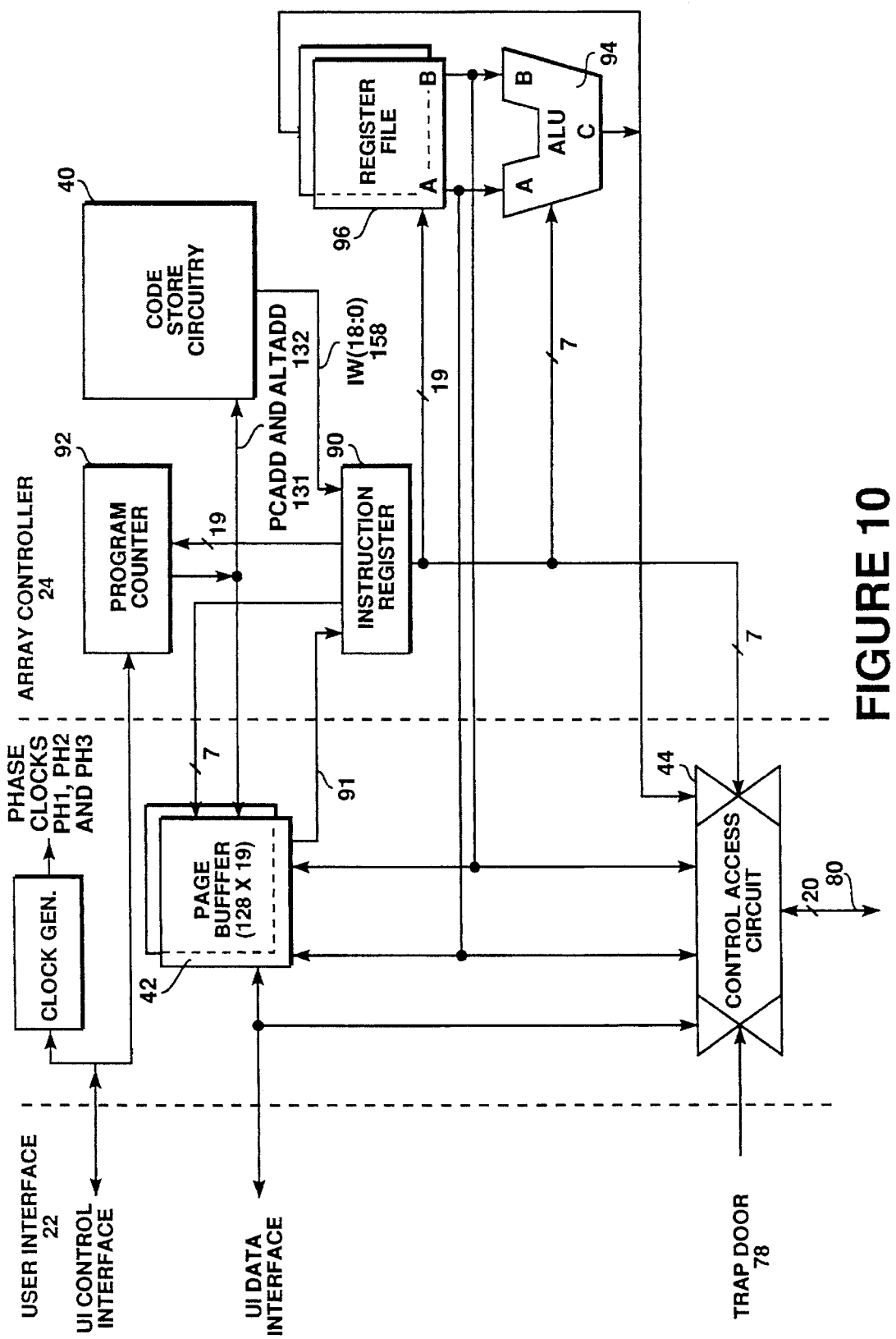
FIG. 10 is a block diagram of an array controller.

A more detailed description of array controller 24 is helpful to understanding the methods for enabling test mode access and permanently disabling test mode access. As shown in FIG. 10, array controller 24 includes code store circuitry 40, instruction register 90, program counter 92, arithmetic logic unit (ALU) 94, and register file 96.

Array controller 24 executes algorithms stored in code store circuitry 40. These algorithms represent instruction words, particularly data transfer instructions, computational instructions, branching instructions and control instructions. Algorithms stored in code store circuitry 40 are accessed via jump vectors received from user interface 22 and program addresses. Program addresses are stored in the first 32 addresses of code store circuitry 40. Code store circuitry 40 receives an address at a time from program counter 92. Code store circuitry 40 outputs instructions, an instruction at a time to instruction register 96, which latches them.

Program counter 92 decodes the next instruction to be executed and points to the proper instruction to follow. The address provided as output of program counter 92 is used to retrieve the next instruction from code store circuitry 40 for transfer to instruction register 90 and execution by ALU 94.

ALU 94 performs all arithmetic and logic functions, and will not be discussed in detail herein. The data input to ALU 94 can be originated from multiple sources, including page buffer 42.

Register file 96 is partitioned into two sections. The first section identified as the main section, contains variables for the algorithm being executed by array controller 24. The second section contains variables for an interrupting algorithm. Therefore, when servicing an interrupt, register file 96 switches the context of array controller 24 from the main section to the second section. All operations are now performed in the interrupt section of register file 96. All variables held in the main section of register file are maintained but not accessible during interrupt servicing. After the interrupt service, control returns again to the main section.

I. The Code Store Circuitry

Figure 11:
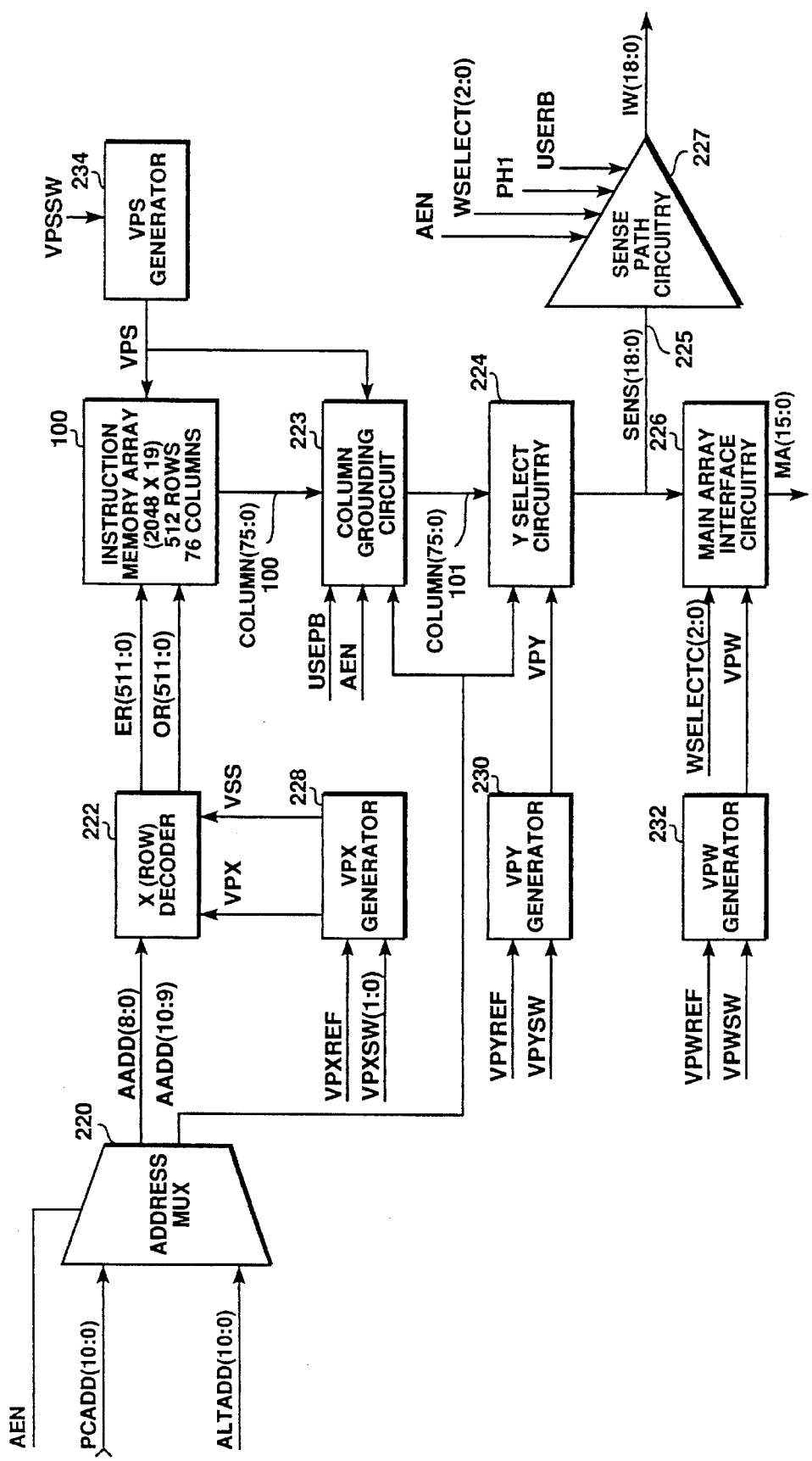
FIG. 11 is a block diagram of the code store circuitry of the array controller.

As discussed above, permanently disabling test mode access requires knowledge of the organization of code store circuitry 40 and its modes of operation. FIG. 11 illustrates in block diagram form code store circuitry 40. Code store circuitry 40 includes instruction memory array 100, address multiplexer 220, X decoder 222, column grounding circuitry 223, Y select circuitry 224, main array interface circuitry 226, sense path circuitry 227 and several voltage generators 228, 230, 232 and 234. Code store circuitry 40 permits modification of the algorithms it stores in non-read modes. As a result, an algorithm change does not require a hardware change within memory device 20.

FIG. 12 lists the input signals and output signals for the modes of code store circuitry 40. Code store circuitry 40 normally operates in read mode, which permits programming, erasure and reading of main memory array 28. In other words, in read mode code store circuitry 40 generates instructions for array controller 24. Program verification of instruction memory array 100 is performed in main access mode, which couples columns of instruction memory array 100 to read/write path 50, rather than sense path circuitry 227.

Operation of code store circuitry 40 in non-read modes requires setting control signals AEN, USEPB, WSELECTC(2:0), ALTADD(10:0), VPXSW, VPYSW, PBCONFIG (2:0) and WSELECTC(2:0) as appropriate to the mode. These control signals can be set by the user to the desired level by addressing and writing to control registers 26. (This requires first enabling test mode access and giving the trap door command.) AEN allows the user to control the address signals applied to instruction memory array 100, switching them from PCADD to ALTADD. USEPB allows the user to program instruction memory array 100 using an algorithm previously stored in page buffer 42. USEPB also configures page buffer 42 to provide instruction words to array controller 24. WSELECTC(2:0) allows the user to couple a selected group of bits from instruction memory array 100 to read/write path 50.

Instruction memory array 100 preferably stores 2048 instruction words, which are each 19 bits wide. Instruction memory array 100 is preferably organized as 76 bitlines and 512 wordlines. The 512 wordlines are organized as 256 even wordlines and 256 odd wordlines. Source straps divide control store memory array 100 into groups of 4 columns. Control store memory array 100 thus includes 19 groups of columns. Each group of columns is then coupled to a sense amp of sense path circuitry 227.

Address multiplexer 220 selects the source of address signals applied to X decoder 222. During read mode, array enable signal AEN selects address signals generated by program counter 92, i.e. PCADD(10:0). AEN selects alternate address signals, ALTADD(10:0), during program and main access modes. These alternate addresses originate from address pins 70, which are coupled to address mux 220 via user interlace 22. Address mux 221 couples the lower 9 bits of its output AADD(8:0) 134 to X decoder 104. The upper 2 bits, AADD(10:9), are coupled to Y select circuitry 224 and column grounding circuitry 222.

X decoder 222 performs row decoding and drives wordlines within instruction memory array 100. During program mode, X decoder 222 pulls selected wordlines to Vpp; i.e., 12 volts, if VPXSW is asserted.

Code store circuitry 40 implements a 4:1 column multiplexer via Y select circuitry 224, column grounding circuit 223 and sense path circuitry 227. This means that four columns of instruction memory array 100 are coupled to a single sense amplifier of sense path circuitry 227. Thus, reading an instruction word from instruction memory array 100 requires deselecting three of every four columns. Column grounding circuit 223 accomplishes this task using decode logic and nineteen column ground circuits. As its name suggests, the decode logic decodes AADD(10:9) and AEN to generate four column ground signals, CG(3:0). The response of the column decode logic to its inputs is indicated in Table II of FIG. 13. These four column ground signals indicate which of the three columns within each group of columns should be grounded. Each of the nineteen column ground circuits uses the four column ground signals to ground three true columns within its associated group of columns.

Y select circuitry 224 selects the columns to be coupled to sense path circuitry 227 by decoding AADD(10:9). Stated another way, Y select circuitry 224 selects SENS(18:0) 225 from Column(75:0) 101 in response to AADD(10:9). Y select circuitry 224 includes Y decode logic and nineteen select circuits. Each select circuit is coupled to a group of columns. Y decode logic decodes AADD(10:9) to generate four select signals, only one of which is active at a time in program, read and main access modes. Each of the nineteen select circuits uses these four select signals to couple one of its associated columns to sense path circuitry 227 via SENS(18:0) 225.

Sense path circuitry 227 operates during read mode. Sense path circuitry 227 generates the instruction word, IW(18:0), from SENS(18:0) 225 using sense amplifiers. Sense path circuitry 227 includes a sense amp controller, a bias generator and 19 sense amplifiers. The sense amp controller controls sense amplifier via precharge signals, a bias enable signal, a reference enable signal and a read signal. The sense amp controller places the sense amplifier in one of two states depending upon the mode of code store circuitry 40, as indicated in Table III of FIG. 14. In all modes other than read, the sense amp controller holds the sense amplifiers in the precharge state and disables bias generator via reference enable signal, REFENB. This prevents the sense amplifiers from driving IW(18:0) and conserves power. The sense amp controller identifies non-read modes via AEN, WSELECTC(2:0) and USEPB.

Main array interface circuitry 226 enables programming and verification of instruction memory array 100 by coupling it to the high voltage circuitry of read/write path 50 in non-read modes. Read/write path 50 is designed around main memory array 28, which stores 16 bit words. Thus, main array interface circuitry 110 selects a group of 16 of the 19 signals to be coupled to mad/write path 50.

VPS Generator 234 generates the voltage applied to the source of each memory cell within instruction memory array 100. VPS Generator 234 couples each source to Vss, i.e. 0 volts.

VPX Generator 228 generates all the voltage levels required by X decoder 222.

VPY Generator 230 generates the voltages used by Y select circuitry 224. A switch signal, VPYSW, switches VPY from 7.5 volts during program mode to approximately 5 volts during read mode.

D. The Page Buffer

As discussed previously, one method of permanently disabling test mode access requires knowledge of the organization of page buffer 42 and its modes of operation.

Page buffer 42 includes two separate 256 by 8 bit static random access memory (SRAM) planes, plane A and plane B. Plane A and plane B each include two 128×8 bit columns, col. A and col. B, and one 128×3 bit column (col. C). Column A and B store byte or word values. Column C stores the three most significant bits when page buffer 42 is being configured to be used to execute an algorithm. These bits are also referred to as remnant bits.

Table IV of FIG. 15 defines the modes of page buffer 42 according to the state of control signals PBCONFIG(2:0). The modes of interest are modes 1, and 7. In mode 1, page buffer 42 functions as the source of instruction words for array controller 24 if the control signal USEPB is active. In mode 1 page buffer 42 is mapped into a single 256 by 19 control store. In mode 6, user interface 22 reads page buffer 42 as an extended 19 bit memory space. Using mode 6, a user is able to verify an algorithm loaded into page buffer 42 prior to executing it. In mode 7, user interface 22 writes to page buffer 42 as a 19 bit memory space. It is in this mode that the user writes into page buffer 42 the algorithms for programming instruction memory array 100.

The user must take care in mode 7 to write the instruction words of the program algorithm in the correct address locations within page buffer 42. The lower 16 bits of each instruction word, IW(15:0), for the first FF (hexadecimal) instruction words must be stored in sequential order in page buffer plane A. The most significant bits of the first FF instruction words, IW(18:16), must be stored in plane C at page buffer addresses 200–27F (hexadecimal). The lower 16 bits of the instruction word for instruction words in excess of 7F(hexadecimal) must be stored in sequential order in page buffer plane B. The most significant bit of these instruction words must be stored in sequential order in plane C at addresses 280–2FF (hexadecimal).

Figure 16:
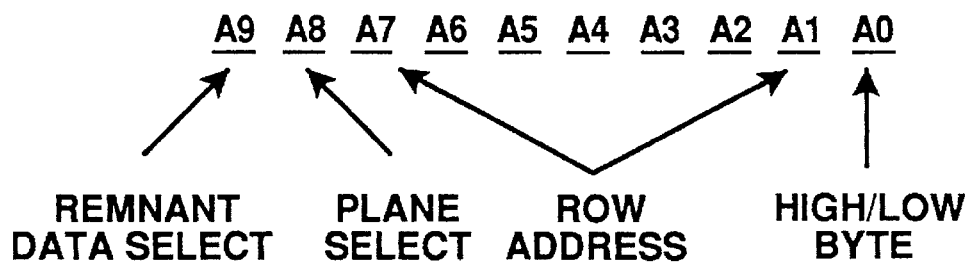
FIG. 16 illustrates the address bit fields for accessing the page buffer.

FIG. 16 illustrates the address bit fields for accessing the desired locations within page buffer 42. Address bit A9 selects column C of plane A or plane B and in modes 1, and 6–7. Address bit A8 functions as a plane select signal for selecting either plane A or plane B. Address bits A7 through A1 select a row within the selected plane. Each row includes 16 bits, designated as a low byte and a high byte. Address bit A0 selects either the high byte or the low byte of a row. Thus, it will be seen that writing a single 19 bit instruction word into page buffer 42 in mode 7 requires 3 operations. One write is required to load in the lower 8 bits of the instruction word. Another write is required to load in the next 8 bits, IW(15:8), and a third write to load in the remnant bits.

E. Personal Computer

Figure 17:
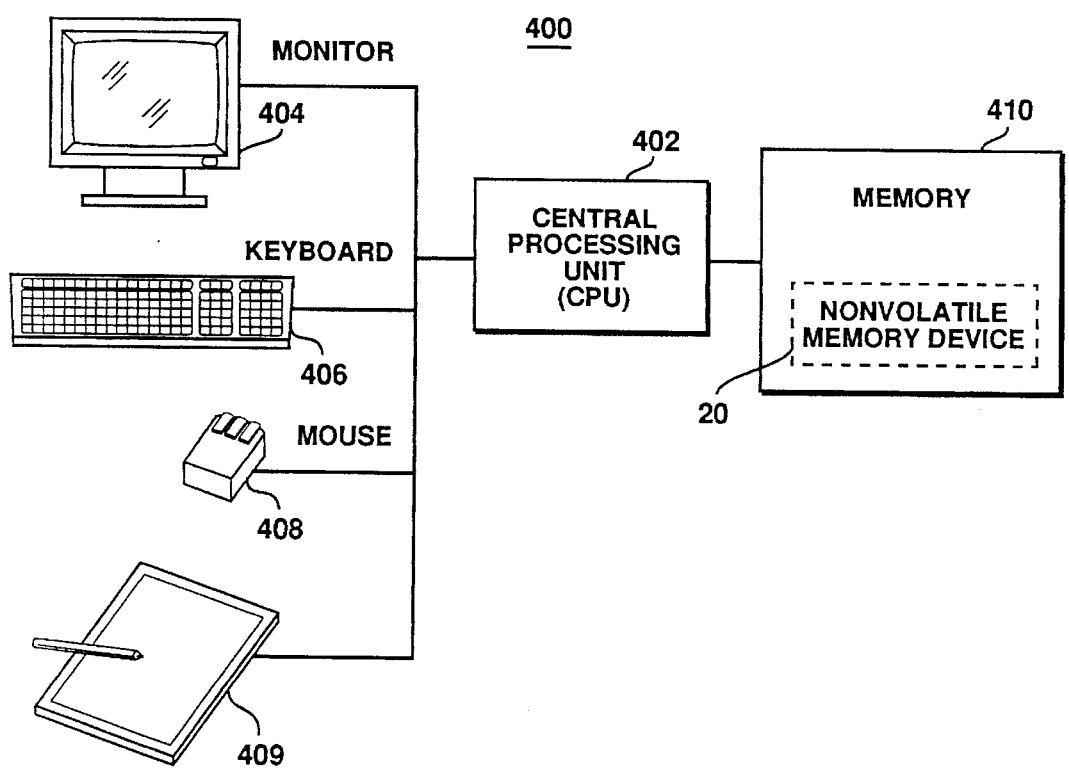
FIG. 17 illustrates a personal computer including the nonvolatile semiconductor memory.

FIG. 17 illustrates in block diagram form personal computer 400, which includes nonvolatile memory devices 20. Personal computer 400 includes central processing unit (CPU) 402 and monitor 404 for visually displaying information to a computer user. Keyboard 406 allows the computer user to input data to CPU 402. By moving mouse 408 the computer user is able to move a pointer displayed on monitor 406. The computer user may also input data to CPU 402 via pen based tablet 409. The user "writes" upon tablet 409 using a pen, wand, stylus, or other manually operated device. Tablet 409 stores the data written to it until it can download to CPU 402. Memory 410 stores data used by CPU 402. Memory 410 typically includes a magnetic disk drive for mass memory storage. Memory 410 also typically includes nonvolatile semiconductor memory devices 20 for storage of data that must be frequently and rapidly accessed. Memory devices 20 includes code store circuitry 40.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of enabling access to a test mode of a semiconductor memory, the semiconductor memory having a first multiplicity of address pins and a second multiplicity of data pins for inputting data signals, the semiconductor memory including a user interface for analyzing the data signals to determine if they represent one of a multiplicity of commands, the multiplicity of commands including a first test mode enable command, a second test mode enable command, and a trap door command, the user interface ignoring the trap door command unless enabled to recognize the test mode access command, the method comprising the steps of:

(A) determining if the first test mode enable command has been received in the user interface;

(B) if the first test mode enable command has been received in the user interface, then determining if a first confirmation code has been received in the user interface;

(C) if the first confirmation code has been received in the user interface, then determining if the second test mode enable command has been received in the user interface;

(D) if the second test mode enable command has been received in the user interface, then determining if a second confirmation code has been received in the user interface, wherein the second confirmation code is different from the first confirmation code;

(E) if the second confirmation code has been received in the user interface, then enabling the user interface to recognize the trap door command.

2. The method of claim 1 wherein the semiconductor memory includes a test mode enable register, the test mode enable register generating a test mode enable signal having an active state and an inactive state, the user interface responding to the active state of the test mode enable signal by executing the trap door command when it is received and the user interface responding to the inactive state of the test mode enable signals by not executing the trap door command when it is received.

3. The method of claim 2, wherein the step (E) further comprises the step of writing a bit to the test mode enable register to bring the test mode enable signal active.

4. A method of enabling access to a test mode of a semiconductor memory, the semiconductor memory having a first multiplicity of address pins and a second multiplicity of data pins, the semiconductor memory including control registers for setting the internal status of the semiconductor memory, the semiconductor memory including a user interface for analyzing signals applied to the data pins to determine if they represent a one of a third multiplicity of commands, the third multiplicity of commands including a first test mode enable command, a second test mode enable command, and a trap door command, the user interface ignoring the trap door command unless enabled to recognize the trap door command, the trap door command giving the user interface access to the control registers, the method comprising the steps of:

a) if the first test mode enable command is received:
      1) determining whether a first group of signals applied to the data pins represent a first confirmation code;
      2) determining whether a second group of signals applied to the address pins represent a second confirmation code;
      3) starting to toll a time period if the first group of signals represents the first confirmation code and the second group of signals represents the second confirmation code;

b) if the second test mode enable command is received before the time period tolls:
      1) determining whether a third group of signals applied to the data pins represent a third confirmation code;
      2) determining whether a fourth group of signals applied to the address pins represent a fourth confirmation code;
      3) enabling the user interface to recognize the trap door command if the third group of signals represents the third confirmation code and the fourth group of signals represents the fourth confirmation code.

5. A method of eliminating access to a test mode of a semiconductor memory device, the semiconductor memory device including a main memory array and an array controller for reading and writing to the main memory array, the array controller including a nonvolatile instruction memory and a logic unit, the instruction memory providing instruction words to the logic unit, the logic unit executing the instructions words, the instruction memory storing at a first address a first pointer pointing to a second address, the instruction memory storing at the second address a test mode algorithm for operating the semiconductor memory device in the test mode, the method of eliminating access to the test mode comprising the steps of:

(a) loading a first algorithm for programming the instruction memory into a buffer, wherein the buffer is coupled to the logic unit:

(b) enabling the buffer to provide instruction words to the logic unit in place of the instruction memory such that the instruction memory is enabled to be programmed;

(c) issuing a command to execute the first algorithm to program a second pointer in the instruction memory at the first address that is not pointing to the second address so as to eliminate the access to the instruction memory at the second address for the test mode algorithm.

6. The method of claim 5 wherein the instruction memory array stores at the second address an algorithm for responding to invalid command sequences.

7. The method of claim 5 wherein the second pointer is programmed without prior erasure of the first address.

* * * * *

UNITED STATES PATENT AND TRADEMARK OFFICE
CERTIFICATE OF CORRECTION

PATENT NO.    : 5,526,311
DATED         : June 11, 1996
INVENTOR(S)   : Kreifels et al.

It is certified that error appears in the above-identified patent and that said Letters Patent is hereby corrected as shown below:

On the title page, in section [57], in line 19 of the Abstract, delete "interlace" and substitute --interface--

In column 4, at line 57, delete "army" and substitute --array--

In column 7, at line 34, insert --an-- between "be" and "event"

In column 9, at line 53, delete "army" and substitute --array--

In column 13, at line 24, delete "interlace" and substitute --interface--

In column 14, at line 17, delete "mad/write" and substitute --read/write--

In column 14, at line 42, insert --6,-- between "1," and "and 7"

Signed and Sealed this

First Day of October, 1996

Attest:

BRUCE LEHMAN

Attesting Officer

Commissioner of Patents and Trademarks